United States Patent [19]
Kubota et al.

[11] Patent Number: 5,654,658
[45] Date of Patent: Aug. 5, 1997

[54] FLIP-FLOP CIRCUIT AND ELECTRONIC DEVICE INCLUDING THE FLIP-FLOP CIRCUIT

[75] Inventors: Katsuhisa Kubota; Kenji Nakamura, both of Kawasaki, Japan

[73] Assignee: Fujitsu Limited, Kawasaki, Japan

[21] Appl. No.: 505,150

[22] Filed: Jul. 21, 1995

[30] Foreign Application Priority Data

Sep. 22, 1994 [JP] Japan .................................. 6-227784

[51] Int. Cl.$^6$ .................................................. H03K 3/289
[52] U.S. Cl. ............................ 327/202; 327/203; 327/211
[58] Field of Search ................................ 327/202–3, 211

[56] References Cited

U.S. PATENT DOCUMENTS 4,730,349  3/1988  Wilhelm et al. .......................... 327/202

OTHER PUBLICATIONS

"Effective Master–Slave Latch Combination" IBM Tech Disc. Bul. vol. 26 No. 3A Aug. 1983 St. Clair.

*Primary Examiner*—Margaret Rose Wambach
*Attorney, Agent, or Firm*—Nikaido, Marmelstein, Murray & Oram LLP

[57] ABSTRACT

A flip-flop circuit has a master circuit including a static flip-flop with a feedback loop, and a slave circuit including a dynamic flip-flop. In the flip-flop circuit, a clock signal is applied to the master circuit and the slave circuit. A clock width of the clock signal is determined by a time period from a clock edge for taking data into the master circuit to another clock edge for closing the master circuit, and is set to less than a given time period.

15 Claims, 17 Drawing Sheets

*: WEAKLY DRIVING INVERTER (TRICKLE INVERTER)

FLIP-FLOP CIRCUIT AND ELECTRONIC DEVICE INCLUDING THE FLIP-FLOP CIRCUIT

BACKGROUND OF THE INVENTION

1. Field of the Invention

The present invention generally relates to a flip-flop circuit and an electronic device including the flip-flop circuit, and more particularly, to a flip-flop circuit which is constructed with CMOS circuits and has a short setup time, a short hold time and a short delay time. The present invention also relates to an electronic device which operates at a high operational speed.

2. Description of the Prior Art (1) Prior art 1:

FIG. 1A shows a schematic diagram of a conventional static-type flip-flop circuit using CMOS circuits. The flip-flop circuit includes inverters 33, 40, 42, 50, 51, 43 and transfer gates 34, 41. FIG. 1B shows a setup time, a hold time and a delay time in the flip-flop circuit shown in FIG. 1A. FIG. 2 shows an example of a configuration of the inverter. In an inverter 104 of FIG. 2, a P-MOS transistor (FET) 105 and an N-MOS transistor (FET) 106 are connected in parallel, and an input signal A is inverted to an output signal Y.

FIG. 3 shows an example of a configuration of the transfer gate. A transfer gate 117 shown in FIG. 3 is constructed with a P-MOS transistor (FET) 118 and an N-MOS transistor (FET) 119 which are connected in series and are driven by complemental clocks (B and /B in FIG. 3, GCK and /GCK in FIG. 1A). When a logic 0 is applied to the P-MOS transistor 118 and a logic 1 is applied to the N-MOS transistor 119, the transfer gate 117 is in a conductive state. When the logic 1 is applied to the P-MOS transistor 118 and the logic 0 is applied to the N-MOS transistor 119, the transfer gate 117 is in an insulating state.

A numeral "/" will be used hereinafter to indicate a reverse signal. For example, a reverse clock /GCK has a reverse phase of that of a clock GCK. Using logical representation, when a state of the clock GCK is 1, a state of the reverse clock /GCK is 0. In general, the clock GCK has the same level transfer timing as that of the reverse clock /GCK. Further, any signal represented by the numeral "/" may have the same function.

In FIG. 1A, a first flip-flop circuit is constructed by returning an output of the inverter 40 to an input of the inverter 40 through the inverter 50 (feedback), and a second flip-flop circuit is constructed by returning an output of the inverter 42 to an input of the inverter 42 through the inverter 51 (feedback).

An output of the inverter 33 is designed so as to have a larger driving ability than an output of the inverter 50. A symbol "*" represents that the inverter has a smaller driving ability, hereinafter.

Therefore, when the transfer gate 34 is in the conductive state, in the first flip-flop circuit constructed with the inverters 40, 50, the output of the inverter 50 is set to the same logic state as that of the output of the inverter 33.

In the same way, the output of the inverter 40 is designed so as to have a larger driving ability than an output of the inverter 51. Therefore, when the transfer gate 41 is in the conductive state, in the second flip-flop circuit constructed with the inverters 42, 51, the output of the inverter 51 is set to the same logic state as that of the output of the inverter 40.

Accordingly, when the transfer gate 34 is in the conductive state (clock GCK=1, reverse clock /GCK=0), an input of the first flip-flop circuit is in the same logic state as that of the output of the inverter 33. After the transfer gate 34 becomes non-conductive, the above state is maintained by the feedback of the inverter 50. In the same way, when the transfer gate 41 is in the conductive state, an input of the second flip-flop circuit is in the same logic state as that of the output of the inverter 40. After the transfer gate 41 becomes non-conductive, the above state is maintained by the feedback of the inverter 51.

In the second flip-flop circuit, for example, in a case that the output of the inverter 40 is at a high level H and the output of the inverter 51 is at a low level L, when the transfer gate 41 becomes conductive by the clocks GCK, /GCK, the output of the weakly driving inverter 51 is transferred to the high level H by the output of the strongly driving inverter 40. And the outputs OUT, /OUT are changed by the inverter 42. A time interval from when the clocks GCK, /GCK are applied to the transfer gate 41 until the outputs OUT, /OUT are changed is associated with a delay time of the flip-flop circuit.

Next, a description will be given of the setup time and the hold time in the flip-flop circuit shown in FIG. 1A, by referring to FIG. 1B. In the first flip-flop circuit, when the clock GCK transits from the high level to the low level, the transfer gate 34 goes from being conductive to non-conductive.

When the clock GCK is at the high level so that the transfer gate 34 is conductive, if the input DIN changes, for example, from the high level to the low level, as shown in a transition (1), first the outputs of the inverters 33, 50 compete with each other. And next, the feedback loop circuit consisting of the inverters 40, 50 operates to stabilize the output of the inverter 40. If the transfer gate 34 becomes non-conductive by the clock GCK becoming the low level after the feedback loop is almost stabilized, the low level of the input DIN is taken into the first flip-flop circuit. The setup time is a minimum time period from the transition of the input DIN to the transition of the clock GCK in the condition that the feedback loop consisting of the inverters 40, 50 is almost stabilized before the transition of the clock GCK. Namely, the setup time approximately corresponds to a period for the competitions between the outputs of inverters 33, 50 and the stabilization of the feedback loop consisting of the inverters 40, 50.

When the input DIN changes as shown in a transition (2) just before the clock GCK becomes the low level, first the outputs of the inverters 33, 50 compete with each other. And next, the feedback loop circuit consisting of the inverters 40, 50 operates to stabilize the output of the inverter 40. However, if the transfer gate 34 becomes non-conductive by the clock GCK becoming the low level before the feedback loop is almost stabilized, the low level of the input DIN is not taken into the first flip-flop circuit. Namely, a state of the first flip-flop circuit which was set by the high level of the input DIN may be held, even if the input DIN changes. The hold time is a maximum time period from the transition of the input DIN to the transition of the clock GCK in the condition that the feedback loop consisting of the inverters 40, 50 is little stabilized at the transition of the clock GCK.

In a gray zone which is represented by subtracting the hold time from the setup time, the low level or the high level of the input DIN may certainly be taken into the first flip-flop circuit.

In the above operation, when the outputs of the inverters 33, 50 compete with each other, the setup time and the hold time respectively are increased. The increase in the setup time and the hold time makes it difficult to increase the operation frequency of the flip-flop circuit.

In general, master/slave-type flip-flop circuits are widely used in the CMOS circuits. The above operation of the first flip-flop circuit is for the master-side flip-flop circuit. The second flip-flop circuit on the slave side operates the same as the first flip-flop circuit. When the output of the inverters 41, 51 compete with each other, the setup time and the hold time of the second flip-flop circuit may also increase.

(2) Prior art 2

In general, to improve an efficiency in examining data of an LSI circuit, a SCAN circuit is added to a flip-flop circuit. In the flip-flop circuit, a large number of logic states in the flip-flop circuit are controlled from a SCAN input of the SCAN circuit, and the logic states in the flip-flop circuit are read out from a SCAN output.

FIG. 4 shows a schematic diagram of the flip-flop circuit shown in FIG. 1A which includes the SCAN circuit and an additional reset circuit. In FIG. 4, an input /RST is a signal to reset the flip-flop circuit to an initial state. An input SIN is a signal to forcibly set a state of a flip-flop circuit consisting of an inverter 54 and a NAND circuit 68 to a state determined by the input SIN in response to a clock ACK for examination of the flip-flop circuit when a transfer gate 53 is in the non-conductive state.

In the flip-flop circuit shown in FIG. 4, to add the reset circuit, a circuit for the feedback loop in a first flip-flop circuit including the inverter 54 is changed from an inverter to the 2-input NAND circuit 68. A configuration of the 2-input NAND circuit 68 may be as shown in FIG. 5. And also, an inverter corresponding to the inverter 42 shown in FIG. 1A is changed to a 2-input NAND circuit 57 to add the reset circuit. A reset signal is applied to the flip-flop circuit so as not to cause a conflict in polarity at each point of the flip-flop circuit.

In general, in a CMOS integrated circuit, a large number of such flip-flop circuits as shown in FIG. 4 are used and are connected in series like a chain. For example, they are connected such that an output /OUT of a 1st flip-flop circuit is connected to an input SIN of a 2nd flip-flop circuit, an output /OUT of the 2nd flip-flop circuit is connected to an input SIN of a 3rd flip-flop circuit, etc.

Further, in the flip-flop circuit shown in FIG. 4, a transfer gate 55 controlled by clocks BCK, /BCK is added. When the flip-flop circuit is used for a normal operation of a system, the transfer gate 55 is maintained to be conductive. When the flip-flop circuit is examined, a transfer gate 65 and the transfer gate 55 becomes alternately conductive and non-conductive so as not to cause a racing condition (condition in which data overtakes the clock without synchronizing to the clock). An examined signal is sequentially shifted through the chained inputs SINs.

(3) Prior art 3

FIG. 6 shows a schematic diagram of a modification of the flip-flop circuit shown in FIG. 1A. In the flip-flop circuit shown in FIG. 6, transfer gates 44, 46 are added to the flip-flop circuit shown in FIG. 1A to respectively prevent the inverters 33, 45 and the inverters 40, 47 from competing with each other. The flip-flop circuit further includes a clock generation circuit having an inverter 39, which generates the complementary clocks /GCK, GCK from a system clock /CLK.

In the flip-flop circuit shown in FIG. 1A, as mentioned before, the inverters 33, 50 and the inverters 40, 51 respectively compete with each other. However, in the flip-flop circuit shown in FIG. 6, since the transfer gate 44 is operative in the reverse clock phase against the transfer gate 34, the inverter 33 and the inverter 45 alternately exclusively control the input of the inverter 40. In the same way, since the transfer gate 46 is operative in the reverse clock phase against the transfer gate 41, the inverter 40 and the inverter 47 alternately exclusively control the input of the inverter 42.

The clocks GCK, /GCK are generated in the clock generation circuit shown in FIG. 6. However, there is a slight phase shift between the clock /GCK and the inverted clock GCK through an inverter 39. Thus, a short period of competition between the inverters 33, 45 may be caused, which competition effects the delay time of the flip-flop circuit.

FIG. 7 shows a schematic diagram of a modification of the flip-flop circuit shown in FIG. 1A. The flip-flop circuit except a clock generation circuit consisting of a NOR circuit 48 and an inverter 49 is the same as the flip-flop circuit shown in FIG. 6. In the clock generation circuit shown in FIG. 7, a control input INH for gating the system clock /CLK is included. Gating the system clock /CLK is carried out by using the 2-input NOR circuit 48. A configuration of the 2input NOR circuit 48 may be as shown in FIG. 8. In a computer control system, the clocks may be controlled for each flip-flop circuit. The above control input INH is used for such purpose.

FIG. 9 shows a schematic diagram of the flip-flop circuit shown in FIG. 7 which further includes the SCAN circuit and the additional reset circuit. The SCAN circuit and the reset circuit are operative in the same way as that of the circuits shown in FIG. 4. In FIG. 9, a clock generation circuit for generating the clocks ACK, /ACK, and a clock generation circuit for generating the clocks BCK, /BCK are also represented as portions of the flip-flop circuit. Timings of these clocks to the respective transfer gates are the same as those in the flip-flop circuit shown in FIG. 7.

FIG. 10 shows a schematic diagram of a modification of the flip-flop circuit shown in FIG. 7. In the flip-flop circuit shown in FIG. 10, an inverter 79 is connected with an output of an inverter 78 to produce an output OUT of the flip-flop circuit from the inverter 79. Other operations are the same as those of the flip-flop circuit shown in FIG. 7.

FIG. 11 shows a time chart indicating an operation of the flip-flop circuit including the SCAN circuit shown in FIG. 4 or FIG. 9. In FIG. 11, after the flip-flop circuit is reset by a negative reset pulse /RST, a first rising edge of the clock /CLK is masked by the control signal INH of the high level to stop a clocking operation. After the control signal INH becomes the low level, the input data DIN of the high level is taken by a second rising edge of the clock /CLK, and the input data DIN of the low level is taken by a third rising edge of the clock /CLK.

Before performing the SCAN operation, the clock BCK is set to the low level. After that, the scan-in-data SIN of the high level is taken into the flip-flop circuit by the clock ACK. By the next exclusive clock BCK, the scan-in data SIN arrives at the output OUT.

(4) Prior art 4

FIG. 12 shows a schematic diagram of a conventional dynamic flip-flop circuit. The dynamic flip-flop circuit is constructed with transfer gates 34, 36 and inverters 33, 35, 37, 38, 39. A capacitor may be connected to an input of the inverter 35 to hold a signal at its node. It is well known that a cell of a dynamic RAM (DRAM) is similar to the above flip-flop circuit, and is constructed with two elements, one MOS transistor for switching and one capacitor for holding data.

In FIG. 12, when the transfer gate 34 is in the non-conductive state, a logic state at the input of the inverter 35 is maintained for a certain time according to the capacitance added to the input. By an such operation, a flip-flop function is realized.

FIG. 13 shows a variation of a voltage at a node, which voltage level is to be held in the flip-flop circuit. As shown in FIG. 13, the level voltage to be held with the capacitor may be degraded due to a leakage, etc., after a length of time.

In the above-mentioned DRAM, in general, the data is held by a refresh operation which stores the data repeatedly at a time interval.

In the dynamic flip-flop circuit shown in FIG. 12, there is no competition between the outputs of the inverters unlike in the flip-flop circuit shown in FIG. 1A. And no delay time due to the feedback loop is caused. Therefore, the dynamic flip-flop circuit has an extremely good performance for the delay time, the setup and hold times. However, it is difficult to hold the data for a long time without using the refresh operation in the DRAM.

In a system operation of circuits including the flip-flop circuit, there are some cases that sequential high-frequency clocks are not applied to the flip-flop circuit. The cases are, for example, i) the clock is masked by the control input INH so as not to be applied, ii) a low-frequency clock having a 50% duty cycle is used in a system setup test, and iii) low-frequency clocks ACK, BCK are used for a test operation. In such cases, the dynamic flip-flop circuit shown in FIG. 12 cannot be used.

As mentioned above, in the flip-flop circuits shown in the above-mentioned prior arts (1), (2), the outputs of the inverters compete with each other and it takes a long time to stabilize the feedback loop. Therefore, there is a problem that the setup time and the hold time are increased.

In the flip-flop circuit shown in the prior art (3), when there is a time delay between the clock /GCK and the clock GCK, a short competition between the outputs of the inverters is caused. Further, there is a problem that a number of circuit elements constructing the transfer gates, etc., is large, and a circuit configuration becomes complex.

In the dynamic flip-flop circuit shown in the prior art (4), there is a problem that it is difficult to use the dynamic flip-flop circuit in the low-frequency operation.

SUMMARY OF THE INVENTION

It is an object of this invention to provide a flip-flop circuit. The flip-flop circuit includes a dynamic circuit which is operable also in a low-frequency cycle. A delay time, a setup time, and a hold time in the flip-flop circuit may be improved. This permits the disadvantages described above to be eliminated.

It is another object of this invention to provide an improved computing system by using the above flip-flop circuit.

The object described above is achieved by a flip-flop circuit comprising: a master circuit including a static flip-flop with a feedback loop; and a slave circuit including a dynamic flip-flop; wherein a clock signal is applied to the master circuit and the slave circuit, a clock width of the clock signal determined by a time period from a clock edge for taking data into the master circuit to another clock edge for closing the master circuit being set to less than a given time period.

The flip-flop circuit mentioned above may further comprise a clock signal generation circuit which generates the clock signal.

In the flip-flop circuit mentioned above, the clock signal generation circuit may further generate clock signals having opposite phases which are applied to the master circuit and the slave circuit.

According to the flip-flop circuit mentioned above, a delay time in the slave circuit may be reduced. This enables the flip-flop circuit to operate at a higher operational speed. Further, even if a clock cycle of the clock signal becomes long, the flip-flop circuit prevents data in the slave circuit from being degraded.

The object described above is also achieved by a flip-flop circuit comprising: master flip-flops connected by a first path having a first delay; and a slave flip-flop and a master flip-flop connected by a second path having a second delay smaller than the first delay; wherein data is transmitted between the master flip-flops through the first path and is transmitted between the slave flip-flop and the master flip-flop through the second path, whereby a racing and an overdelay are prevented.

According to the flip-flop circuit mentioned above, by properly combining the master flip-flop and the slave flip-flop, the racing and the overdelay may be prevented. This makes it possible to construct a computer system operating at a higher clock speed.

The object described above is also achieved by an electronic device comprising: a flip-flop circuit having a master circuit including a static flip-flop with a feedback loop and a slave circuit including a dynamic flip-flop; a clock signal generation circuit generating a clock signal to the flip-flop circuit, a clock width of the clock signal being determined by a time period from a clock edge for taking data into the master circuit to another clock edge for closing the master circuit and being set to less than a given time period; and a logic circuit.

According to the electronic device, the delay time in the electronic device may be improved. Therefore, the electronic device may operate at the higher operational speed as compared with the device using the conventional flip-flop circuits.

Other objects and further features of the present invention will be apparent from the following detailed description when read in conjunction with the accompanying drawings.

Figure 14:
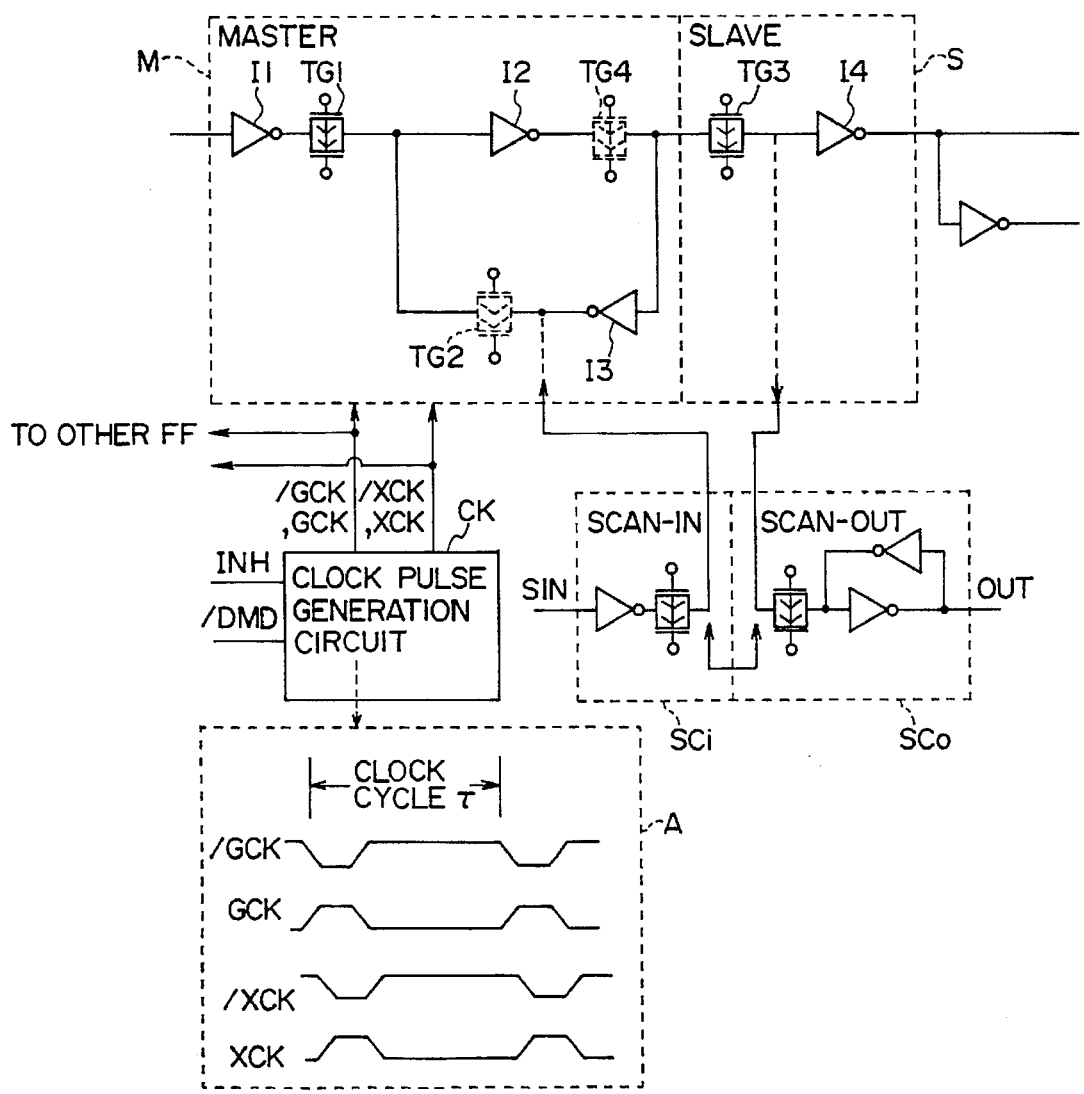
FIG. 14 shows a basic configuration for explaining an operation principle of a flip-flop circuit according to the present invention.

DESCRIPTION OF THE PREFERRED EMBODIMENTS (1) Basic configurations of flip-flop circuits according to the present invention:

First, a description will be given of an operation principle of a flip-flop circuit according to the present invention, by referring to FIG. 14. FIG. 14 shows a basic configuration for explaining the operation principle of the flip-flop circuit according to the present invention. The flip-flop circuit is constructed with a master circuit M and a slave circuit S, and further includes a clock pulse generation circuit CK and scan circuits SCi, SCo.

The slave circuit S is constructed with a dynamic flip-flop circuit consisting of a transfer gate TG3 and an inverter 14. The master circuit M is constructed with a feedback-loop type (static) flip-flop circuit consisting of inverters I2, I3 and transfer gates TG1, TG2. Because the dynamic flip-flop circuit is used as the slave circuit S, a delay due to the inverters competing in the static flip-flop circuit may be reduced. Therefore, this makes it possible to achieve a high-speed operation in the flip-flop circuit.

A part A of FIG. 14 shows waveforms of clock pulses generated by the clock pulse generation circuit CK. Clock pulse signals GCK, /GCK are mainly applied to the transfer gates TG1, TG3, and clock pulse signals XCK, /XCK are mainly applied to the transfer gate TG2. In general, a time period after data is set into the master circuit M by a clock edge until the transfer gate is closed by the next clock edge is determined by a width of the clock pulse. In the clock pulse signals GCK, /GCK, each width of the clock pulse signals is set to less than a given width regardless of frequency of the clock pulse signals.

In other words, the width of a negative part of the clock pulse signal /GCK, in which the data is set to the master circuit M, is maintained at a constant time period. During this period, data set to the slave circuit S is held. Therefore, when a cycle rate of the clock pulse signal becomes low, the width of a positive part of the clock pulse signal /GCK, in which the data from the master circuit M is set to the slave circuit S to be produced, becomes long. Accordingly, even if the cycle rate of the clock pulse signal becomes low, the data in the dynamic flip-flop circuit of the slave circuit is not degraded because a sufficient time to hold the data in the slave circuit S is ensured by the constant time period of the clock pulse signal.

Figure 15A:
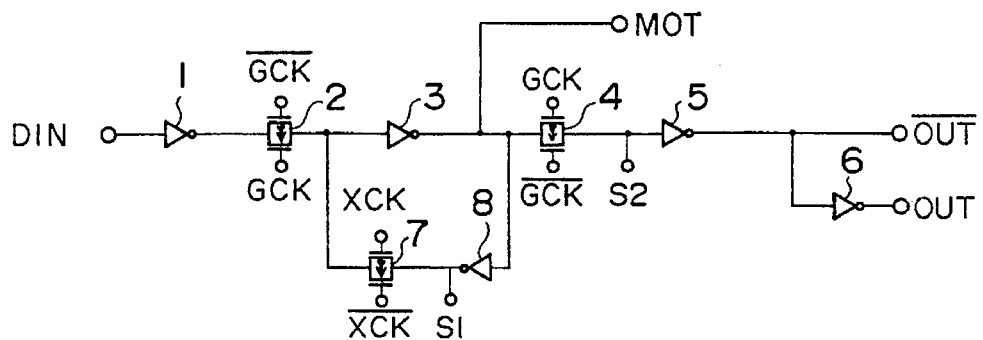
FIG. 15A shows a configuration of a binary-phase-clock quasi-static flip-flop circuit according to the present invention.
Figure 15B:
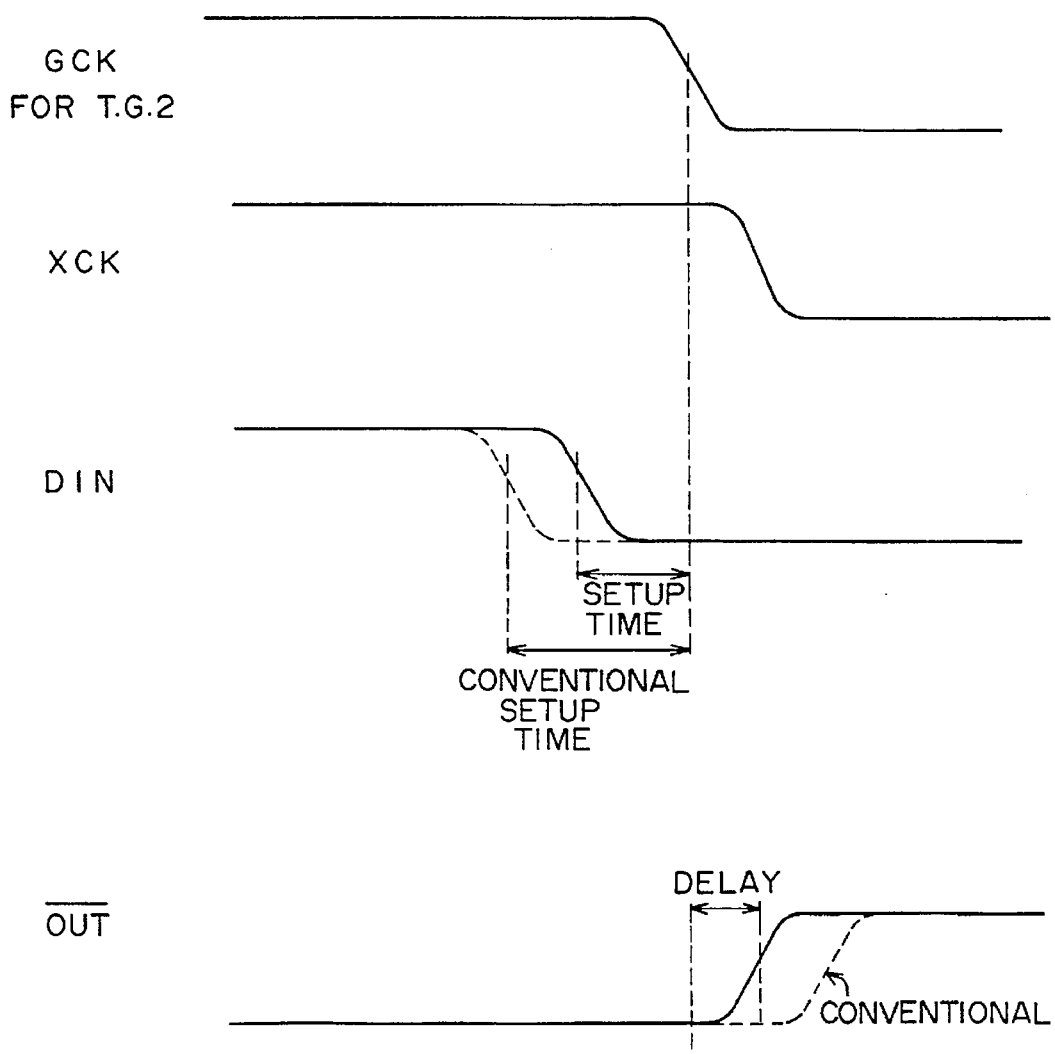
FIG. 15B shows an operation of the flip-flop circuit according to the present invention shown in FIG. 15A.
Figure 16:
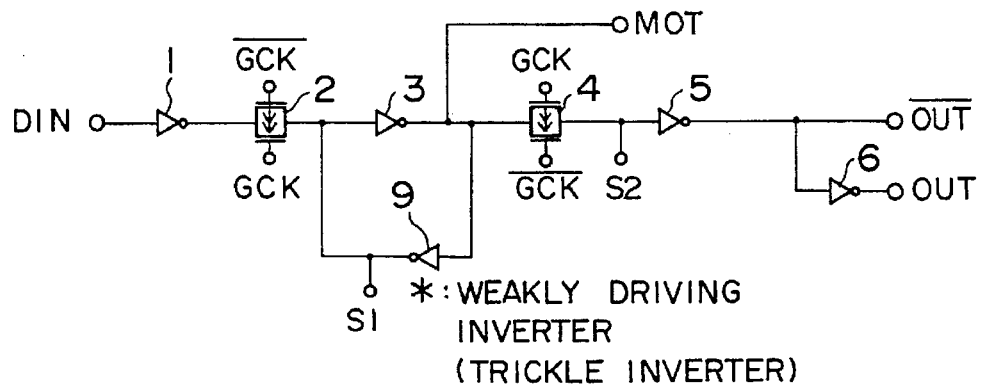
FIG. 16 shows a configuration of a first modification of the flip-flop circuit shown in FIG. 15A.
Figure 17:
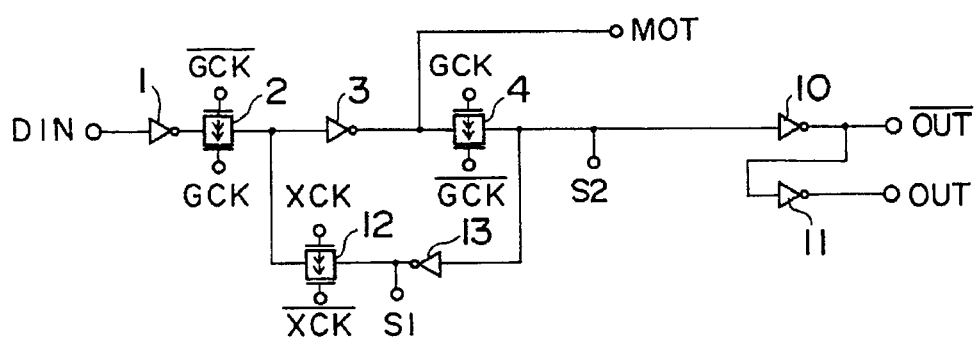
FIG. 17 shows a configuration of a second modification of the flip-flop circuit shown in FIG. 15A.
Figure 18:
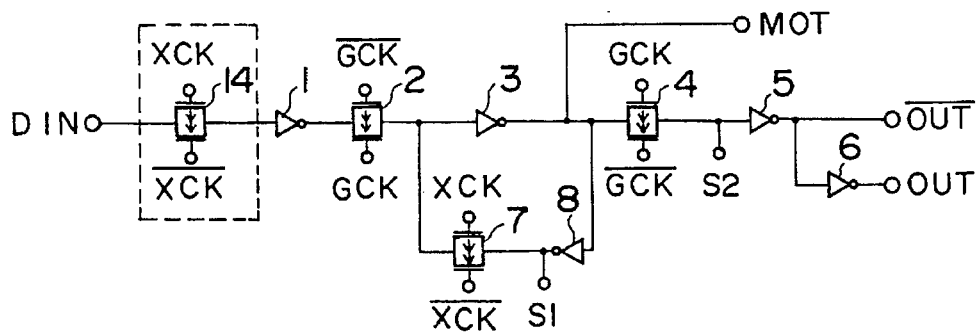
FIG. 18 shows a configuration of the flip-flop circuit shown in FIG. 15A including a slave flip-flop circuit in its input part.

Next, descriptions will be given of embodiments of the flip-flop circuit according to the present invention, by referring to FIG. 15A to FIG. 18. FIG. 15A shows a configuration of a binary-phase-clock quasi-static flip-flop circuit according to the present invention. FIG. 15B shows an operation of the flip-flop circuit according to the present invention shown in FIG. 15A. FIG. 16 shows a configuration of a first modification of the flip-flop circuit shown in FIG. 15A. FIG. 17 shows a configuration of a second modification of the flip-flop circuit shown in FIG. 15A. FIG. 18 shows a configuration of the flip-flop circuit shown in FIG. 15A including a slave flip-flop circuit in its input part.

Figure 19:
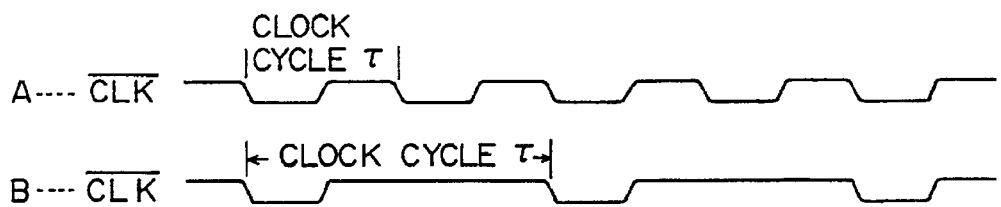
FIG. 19 shows a clock waveform applied to the flip-flop circuits.
Figure 20:
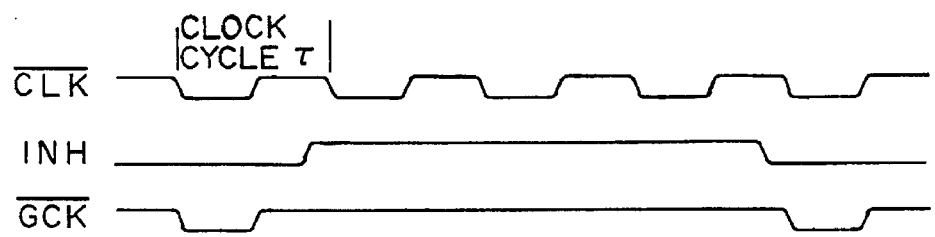
FIG. 20 shows a clock waveform applied to the flip-flop circuits.

Further, each flip-flop circuit has the clock generation circuit in which the clocks GCK, /GCK are generated based on the clock /CLK. FIG. 19 and FIG. 20 respectively show clock waveforms applied to the above flip-flop circuits.

The clocks XCK, /XCK shown in FIGS. 15, 17, 18 have respectively the same phases as those of the clocks GCK, /GCK, or have respectively phases which are delayed a little from the clocks GCK, /GCK. For example, in FIG. 15A, to prevent competition between inverters 1, 8, the clocks XCK, /XCK are delayed a little from the clocks GCK, /GCK.

In FIGS. 15 to 18, ports S1, S2 are respectively a scan-in port and a scan-out port which are to be connected to a scan circuit (will be mentioned in detail later), and a port MOT indicates an output of the master circuit in each flip-flop circuit.

Figure 12:
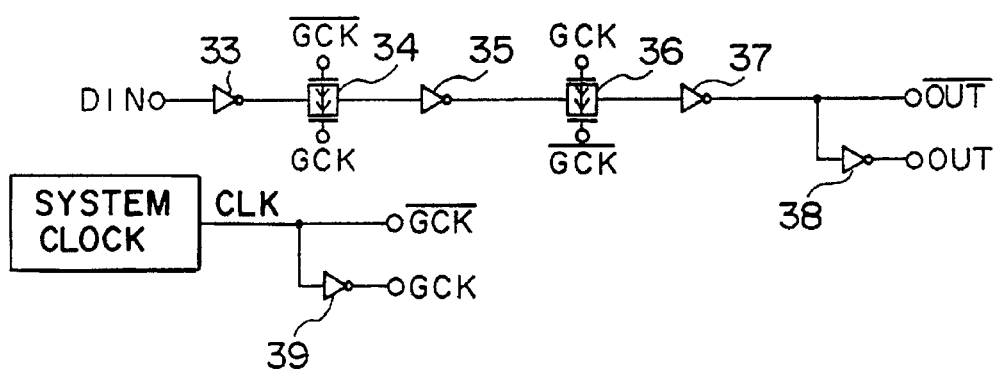
FIG. 12 shows a schematic diagram of a conventional dynamic flip-flop circuit.

In FIG. 15A, the slave circuit is constructed with the dynamic flip-flop circuit consisting of a transfer gate 4 and an inverter 5. The basic operation of the dynamic flip-flop circuit has already been described with reference to FIG. 12. The master circuit is constructed with the feedback-loop type flip-flop circuit consisting of inverters 3, 8 and transfer gates 2, 7.

Namely, the flip-flop circuit shown in FIG. 15A is constructed with the static flip-flop circuit as the master circuit and the dynamic flip-flop circuit as the slave circuit. Since the slave circuit is the dynamic flip-flop circuit, the delay in the slave circuit is improved as compared with the conventional flip-flop circuit including the static flip-flop circuit as the slave circuit.

FIG. 19 shows the clock waveform to operate the binary-phase-clock quasi-static flip-flop circuit shown in FIG. 15A. In a part A of FIG. 19, the clock /CLK indicates a high-frequency clock, and in a part B thereof, the clock /CLK indicates a low-frequency clock.

In FIG. 19, the width of the negative part of the clock pulse /CLK, in which the data DIN is taken into the master circuit, is set to less than the given width, even if the clock cycle is extended.

As shown in part B of FIG. 19, when the frequency of the clock becomes low (the clock cycle becomes long), the positive part of the clock pulse /CLK, in which the data from the master circuit is transferred into the slave circuit to be output (the transfer gate 4 is conductive), becomes longer than the positive part of the clock shown in part A of FIG. 19.

Figure 13:
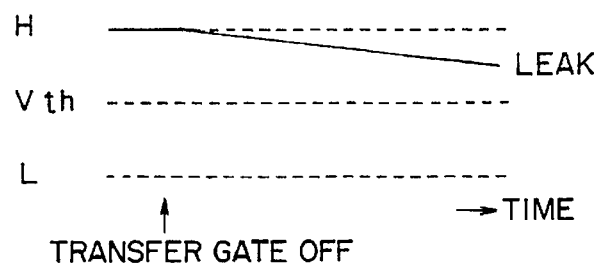
FIG. 13 shows variation of a level at a node to be held in the flip-flop circuit.

Therefore, even if the clock cycle becomes long, the data which has been taken into the dynamic flip-flop circuit of the slave circuit is not degraded. Since the master circuit is constructed with the static flip-flop circuit and the transfer gate 4 is conductive in the positive part of the clock cycle, the hold data shown in FIG. 13 may not be degraded.

Figure 39:
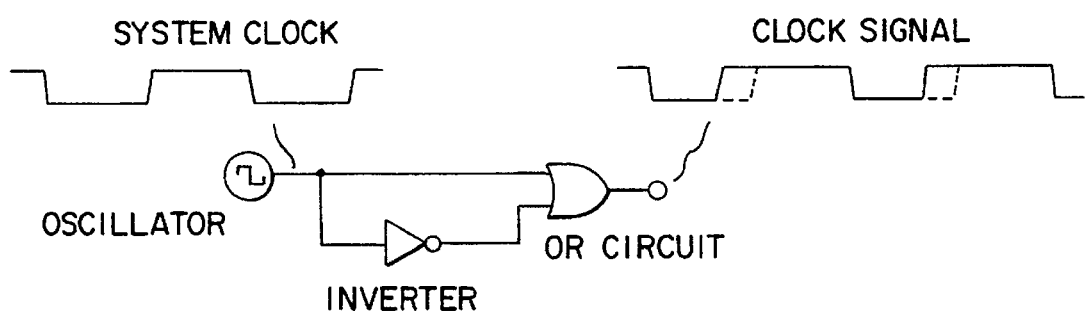
FIG. 39 shows an example of a clock pulse generation circuit.

FIG. 39 shows a configuration example of the clock pulse generation circuit. The clock pulse generation circuit is called a clock chopper circuit, and comprises an oscillator generating a clock signal (a system clock), a delay circuit (for example, inverters), and an OR circuit. In the circuit shown in FIG. 39, the OR circuit combines the clock signal and a delayed clock signal through the inverter. In an output signal of the OR circuit the clock width (a part of a low level, in this case) may be changed according to a delay time of the inverter (for example, which can be changed by the number of inverters). Therefore, the clock pulse width at the low level may be adjusted to less than the given time period.

In the clock waveforms shown in FIG. 20, the clock /GCK is formed by interrupting 3 pulses in the clock /CLK by a clock control signal INH. In the same way as FIG. 19, since the positive part of the clock /GCK is extended, such clock /GCK may operate the flip-flop circuit shown in FIG. 15A without causing leakage.

In FIG. 15A, the transfer gate 7 is located in the feedback loop consisting of the inverters 3, 8. When the transfer gate 7 becomes conductive at the rising edge of the clock /XCK, the output of the inverter 1 may compete with the output of the inverter 8. However, as shown in FIG. 15B, by delaying the clock /XCK from the /GCK, the instance when the transfer gate 7 becomes conductive is also delayed. And, thus, undesired competition between the outputs of the inverters 1, 8 may be prevented. Accordingly, this may improve the setup time and the hold time of the flip-flop circuit.

Further, FIG. 15B also shows that the delay time of the flip-flop circuit according to the present invention is reduced by adopting the dynamic flip-flop circuit as the slave circuit.

FIG. 16 is the first modification of the flip-flop circuit shown in FIG. 15A. In the flip-flop circuit shown in FIG. 16, the transfer gate 7 is eliminated from the flip-flop circuit shown in FIG. 15A. An inverter 1 shown in FIG. 16 is designed to have a larger driving ability in the output than that of an inverter 9. The flip-flop circuit is also driven by the clocks shown in FIGS. 19, 20, the degradation of the hold data may be prevented in the same way as that in FIG. 15A.

FIG. 17 shows the second modification of the flip-flop circuit shown in FIG. 15A. In the flip-flop circuit shown in FIG. 17, the transfer gate 4 in the slave circuit is moved to the circuit constructing the feedback loop in the quasi static.

According to this configuration, a load of a path to the master output MOT is moved to the right side of the transfer gate 4, and thus, this enables the flip-flop circuit to operate at a higher speed. As will be mentioned in detail later, when the SCAN function is added, the flip-flop circuit has an advantage that an output condition in the slave circuit may be also read out.

FIG. 18 shows the third modification of the flip-flop circuit shown in FIG. 15A. In the flip-flop circuit shown in FIG. 18, the transfer gate 14 encompassed by the block shown in a dotted line is added to the input part of the flip-flop circuit shown in FIG. 15A.

In the same way as that in the transfer gate 4 shown in FIG. 17, the transfer gate 14 is driven by the clocks having an inverse polarity to that of the clocks used in the master flip-flop circuit. If the transfer gate 14 is not located in the input part, the input data may arrive top early to the data input DIN and a racing (an error state that the master flip-flop circuit takes also the next cycle data in addition to the present cycle data) may be caused. The transfer gate 14 may prevent the racing from being caused.

When an output timing of the master circuit output MOT is determined by a leading edge of the clock, the racing is easily caused in the master flip-flop circuit driving the data input DIN. The transfer gate 14 is significantly effective on such a circuit.

(2) SCAN circuit

Figure 21A:
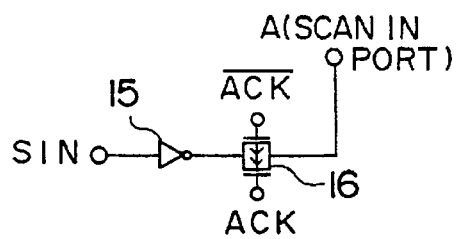
FIGS. 21A, 21B show a SCAN circuit part of the flip-flop circuit according to the present invention.
Figure 21B:
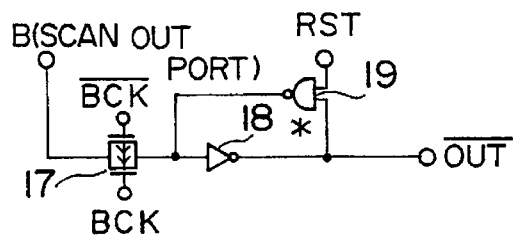

FIGS. 21A, 21B show a SCAN circuit part of the flip-flop circuit according to the present invention.

FIG. 21A shows a scan-in Circuit passing an output of a front flip-flop circuit in a SCAN chain to the desired flip-flop circuit through the scan-in SIN. A transfer gate 16 of the scan-in circuit is controlled by a clock ACK for an examination. A port A (SCAN-IN port) is connected to the port S1 shown in FIGS. 15 to 18. When the clock GCK stops being applied to the flip-flop circuit, if the clock ACK for the examination is applied to it, the desired flip-flop circuit is forcibly set to a condition which is determined by the input SIN.

FIG. 21B shows a scan-out circuit reading a state from a desired flip-flop circuit by a clock BCK, and passing the state to the next stage in the SCAN chain. The scan-out circuit is constructed with a static flip-flop circuit, which comprises a transfer gate 17, a feedback circuit including a two-input NAND 19, and an inverter 18. The NAND 19 has a reset port /RST as one of the inputs. The NAND 19 is designed to have a weaker driving ability in the output than that in the output of the desired flip-flop circuit.

A port B (SCAN OUT port) is connected to the port S2 shown in FIGS. 15 to 18. The transfer gate 16 and the transfer gate 17 exclusively repeat the conductive state and the non-conductive state by the alternative clocking of the clocks BCK, ACK. Therefore, the signal is shifted through the chain path of the above SIN.

Figure 1A:
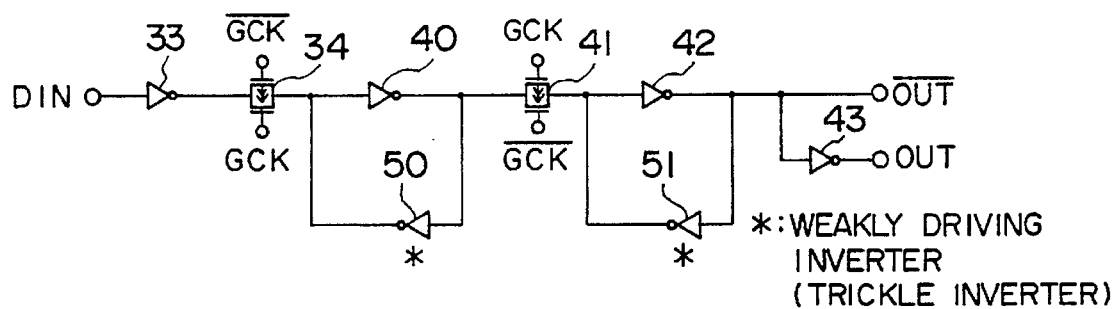
FIG. 1A shows a schematic diagram of a conventional static-type flip-flop circuit which is used in CMOS circuits.
Figure 1B:
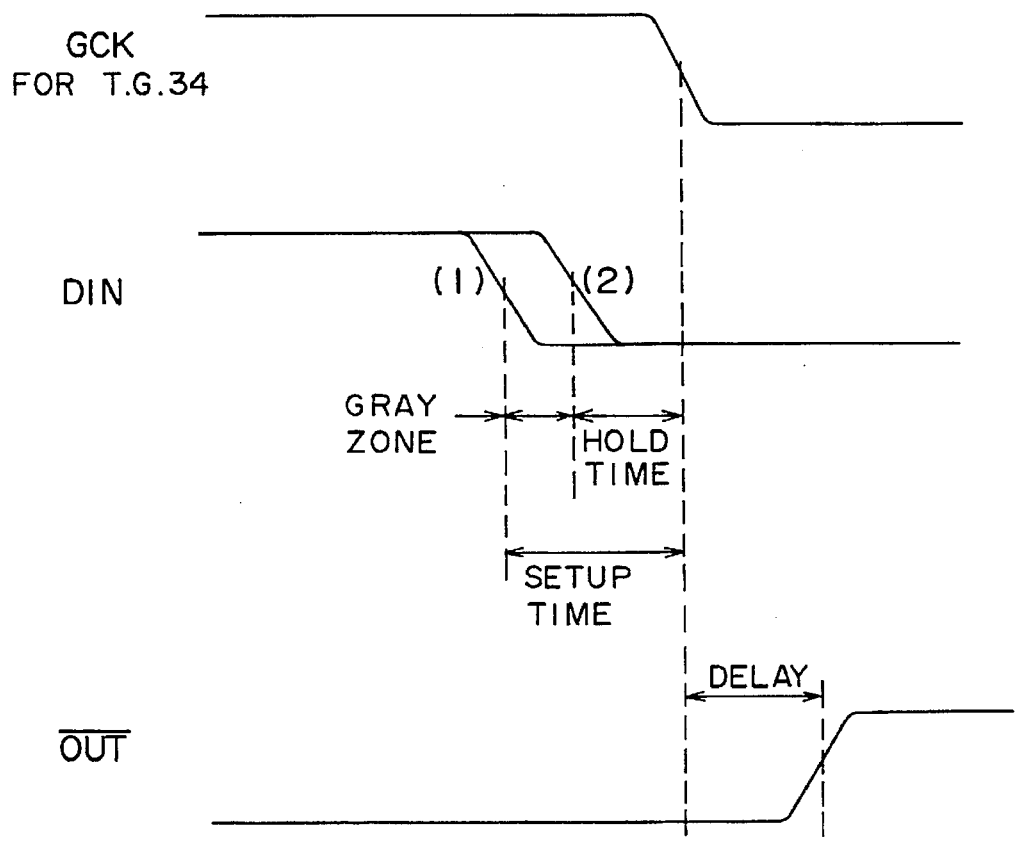
FIG. 1B shows a setup time and a hold time in the flip-flop circuit shown in FIG. 1A.
Figure 2:
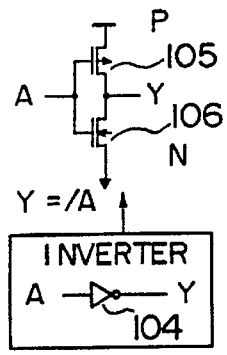
FIG. 2 shows an example of a configuration of an inverter.
Figure 3:
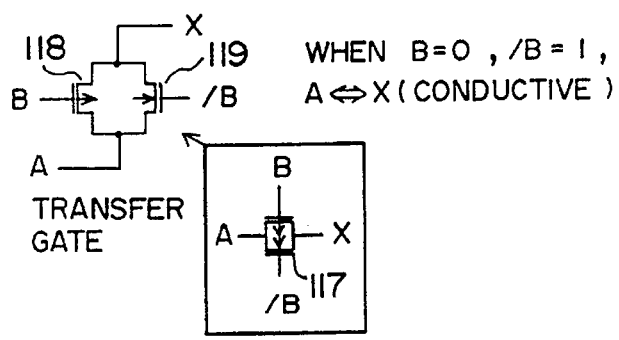
FIG. 3 shows an example of a configuration of a transfer gate.
Figure 4:
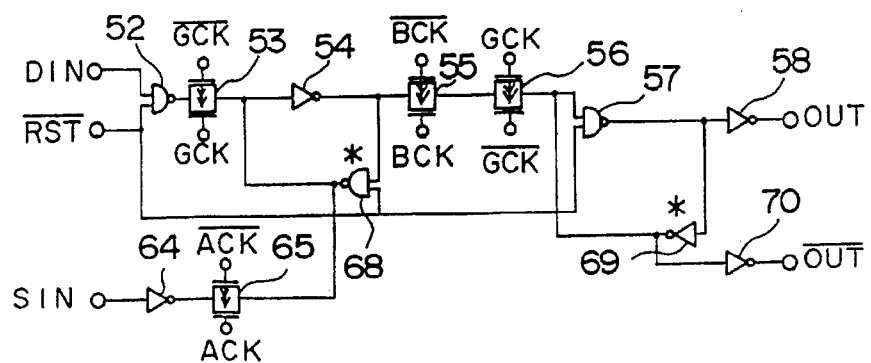
FIG. 4 shows a schematic diagram of the flip-flop circuit shown in FIG. 1A which further includes a SCAN circuit and an additional reset circuit.
Figure 5:
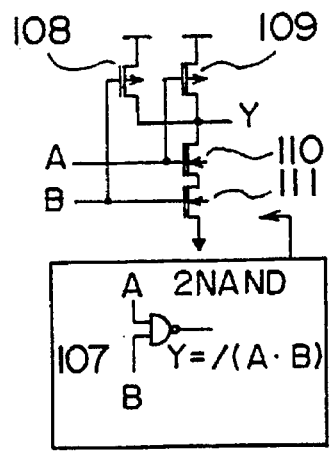
FIG. 5 shows a schematic diagram of a 2-input NAND circuit.
Figure 6:
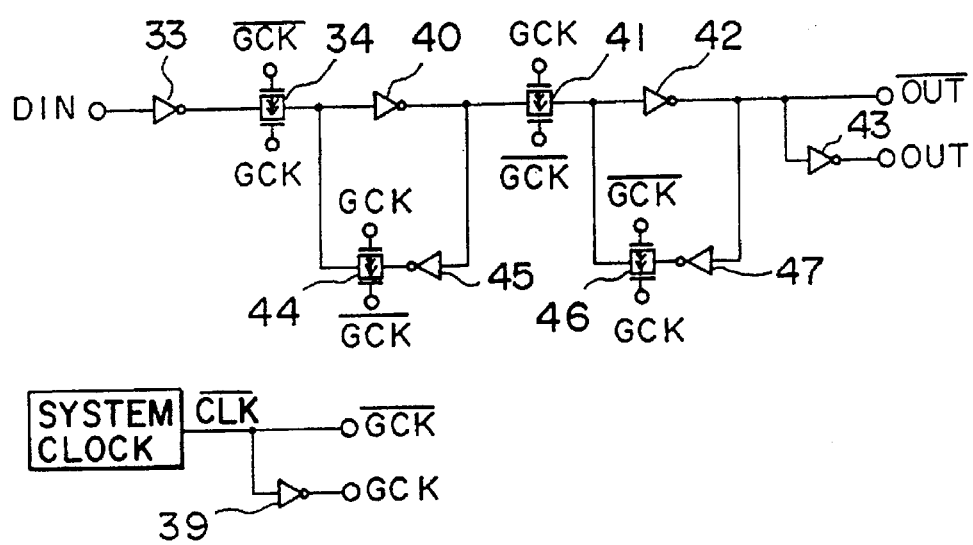
FIG. 6 shows a schematic diagram of a modification of the flip-flop circuit shown in FIG. 1A.
Figure 7:
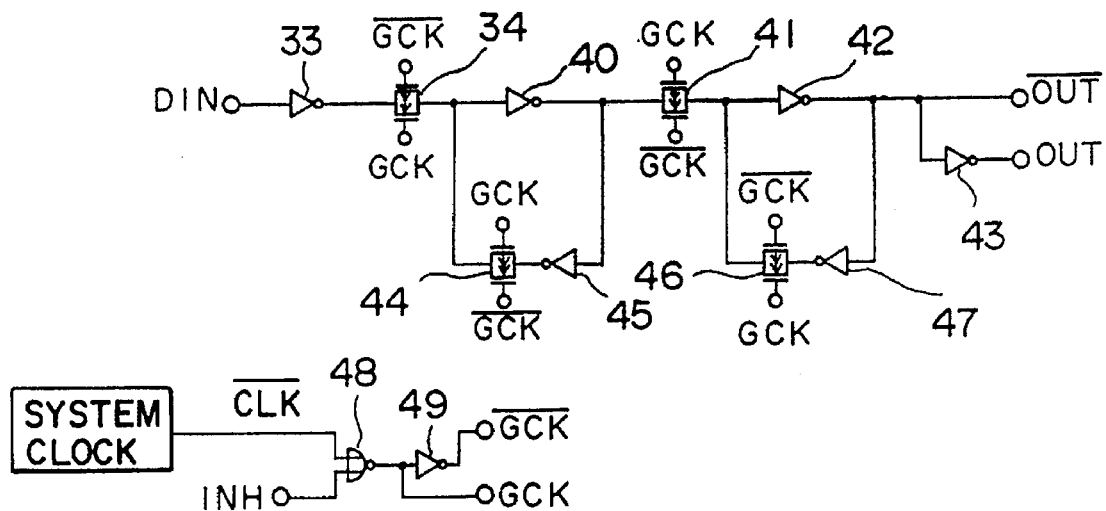
FIG. 7 shows a schematic diagram of a modification of the flip-flop circuit shown in FIG. 1A.
Figure 8:
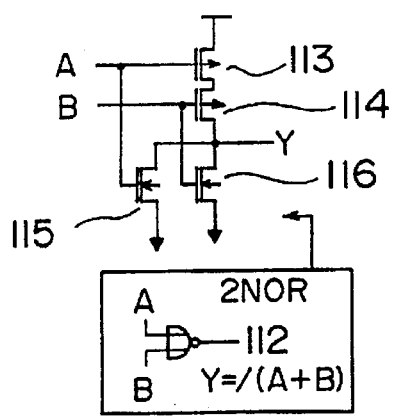
FIG. 8 shows a schematic diagram of a 2-input NOR circuit.
Figure 9:
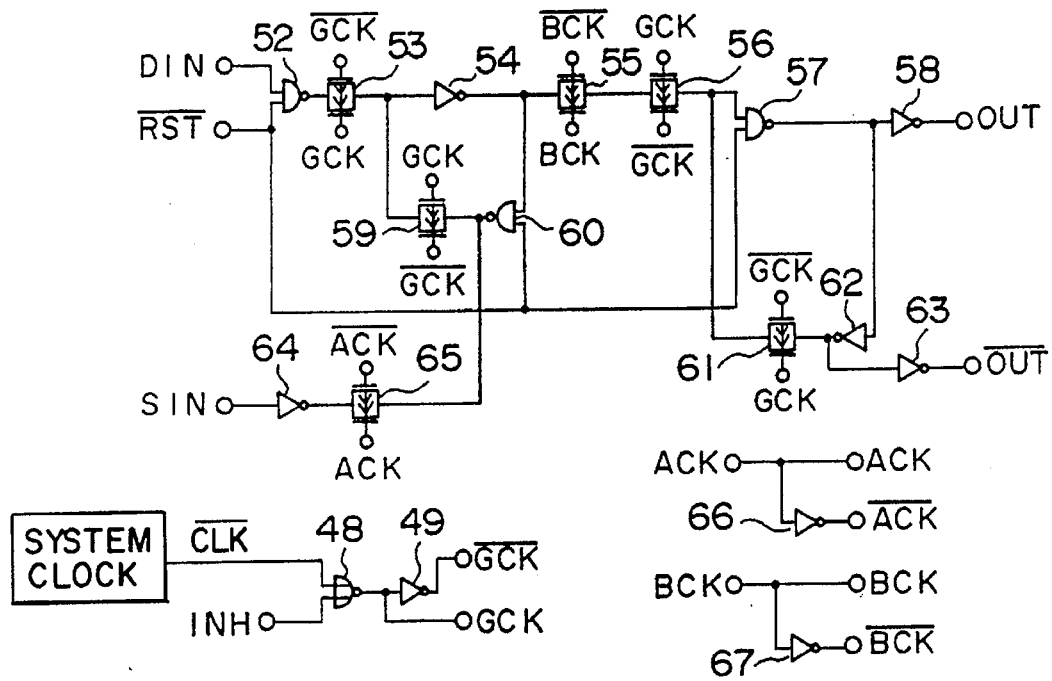
FIG. 9 shows a schematic diagram of the flip-flop circuit shown in FIG. 7 which further includes the SCAN circuit and the additional reset circuit.
Figure 10:
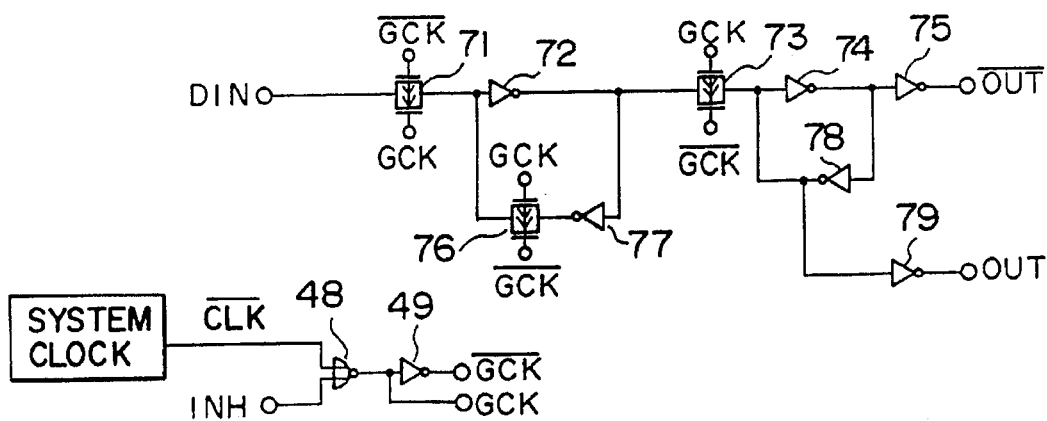
FIG. 10 shows a schematic diagram of a modification of the flip-flop circuit shown in FIG. 7.
Figure 11:
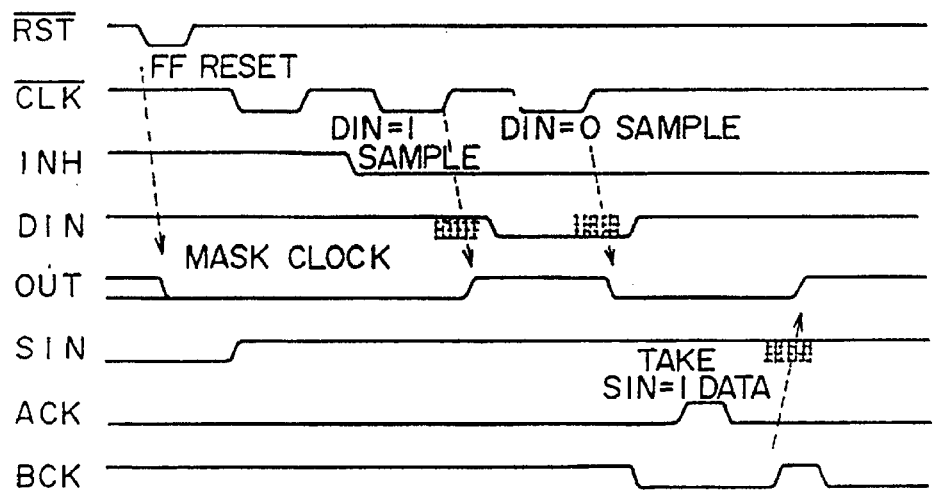
FIG. 11 shows a time chart indicating an operation of the flip-flop circuit including the SCAN circuit shown in FIG. 4 or FIG. 9.

In the conventional flip-flop circuits shown in FIGS. 4 and 9, the feedback loop in the slave circuit is commonly used as the feedback loop in the scan-out circuit. On the contrary, the scan-out circuit has the feedback loop by itself. However, the scan-out circuit has no affect on the system operation speed. Therefore, when the scan circuit is constructed by small devices, an overhead may be reduced.

Figure 22:
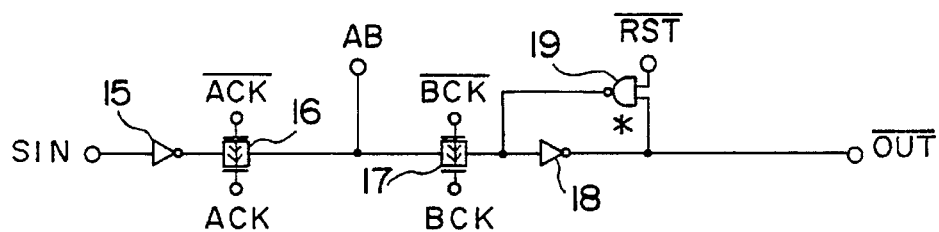
FIG. 22 shows a scan circuit in which the scan-in circuit shown in FIG. 21A and the scan-out circuit shown in FIG. 21B are combined together.

FIG. 22 shows a SCAN circuit in which the scan-in circuit shown in FIG. 21A and the scan-out circuit shown in FIG. 21B are combined together. The SCAN circuit has a single port AB for transmitting and receiving to/from the flip-flop circuit. The data from the SCAN circuit is passed to the flip-flop circuit through the port AB, and the state in the flip-flop circuit is read out to the SCAN circuit through the port AB. Also in the flip-flop circuit, a single port is used for connection to the SCAN circuit. In fact, for example, the port AB in the SCAN circuit shown in FIG. 22 may be connected to the port S1 in the flip-flop circuits shown in FIGS. 15 to 18 to carry out the scan operation.

Figure 23:
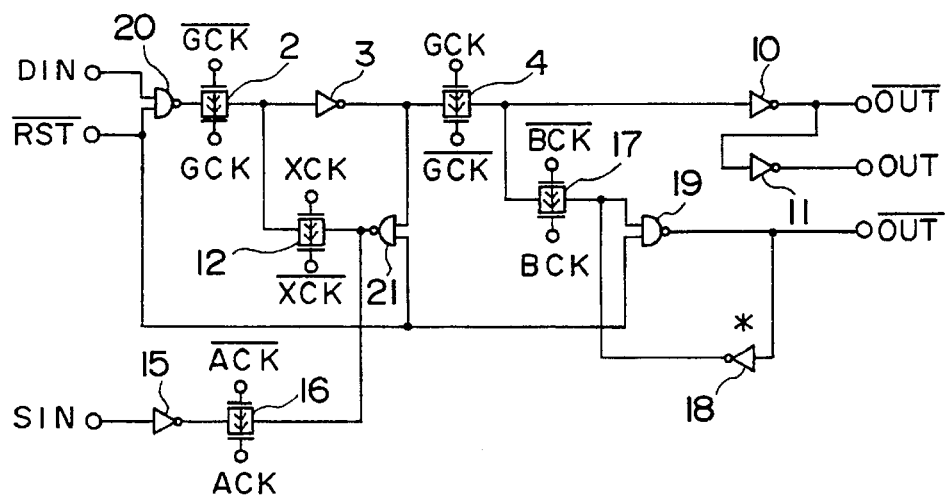
FIG. 23 shows the flip-flop circuit shown in FIG. 15A to which the scan-in circuit shown in FIG. 21A and the scan-out circuit shown in FIG. 21B are added.

FIG. 23 shows the flip-flop circuit shown in FIG. 15A to which the scan-in circuit shown in FIG. 21A and the scan-out circuit shown in FIG. 21B are added. In the flip-flop circuit shown in FIG. 23, to apply reset input, two two-input NANDs 20, 21 are located instead of the inverters 1, 8 shown in FIG. 15A. However, a basic operation of the flip-flop circuit shown in FIG. 23 is the same as that of the flip-flop circuit shown in FIG. 15A.

Figure 24:
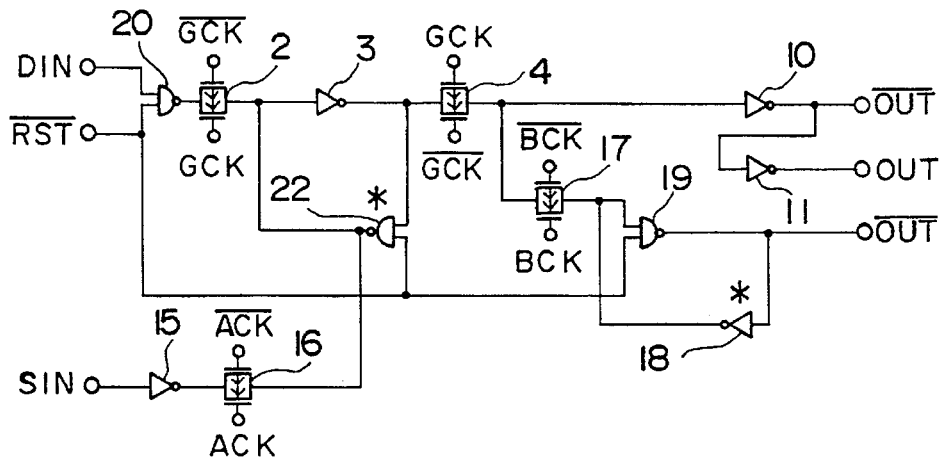
FIG. 24 shows the flip-flop circuit shown in FIG. 16 to which the scan-in circuit shown in FIG. 21A and the scan-out circuit shown in FIG. 21B are added.
Figure 25:
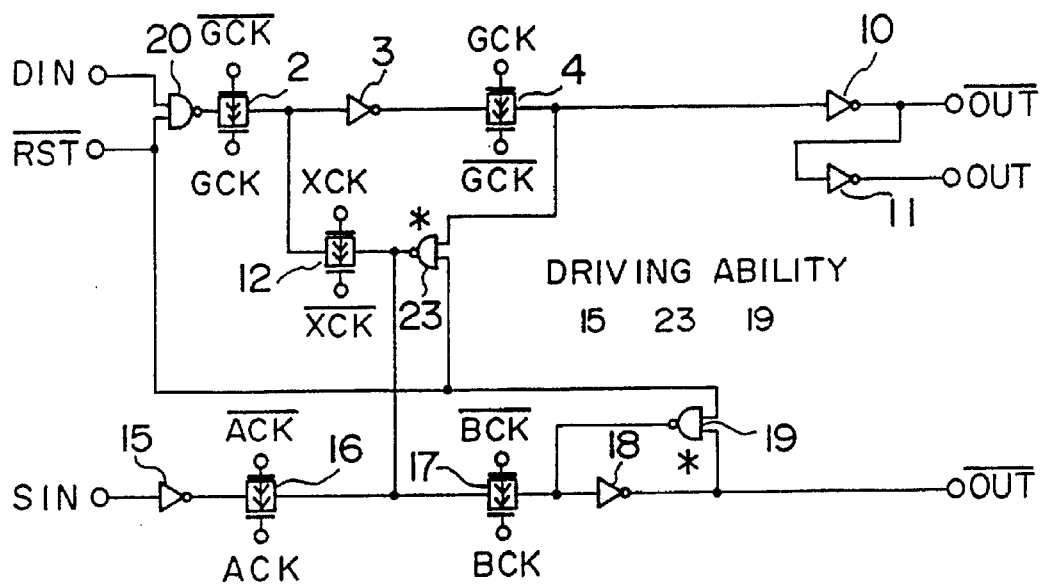
FIG. 25 shows the flip-flop circuit shown in FIG. 17 to which the SCAN circuit shown in FIG. 22 is added.

FIG. 24 shows the flip-flop circuit shown in FIG. 16 to which the scan-in circuit shown in FIG. and the scan-out circuit shown in FIG. 21B are added. And FIG. 25 shows the flip-flop circuit shown in FIG. 17 to which the SCAN circuit shown in FIG. 22 is added. Operations of the flip-flop circuits shown in FIGS. 24 and 25 are respectively the same as that of the circuit shown in FIG. 23.

In the flip-flop circuits shown in FIGS. 23, 24 and 25, the delay of the flip-flop circuit is mainly determined by gates and a load in a path from a clock applied point (GCK, /GCK inputs in the transfer gate 2) to the output OUT, or /OUT. When comparing the three circuits, the flip-flop circuit shown in FIG. 25 has the least number of gates and the smallest load, because there is no shunt path at the output of the inverter 3. Therefore, the flip-flop circuit shown in FIG. 25 is operable at the highest speed as compared to the other two circuits shown in FIGS. 23 and 24.

As mentioned before by referring to FIG. 17, a scan out SCANOUT of the flip-flop circuit shown in FIG. 25 is derived from a node after a slave clock stage (transfer gate 4). Therefore, though one shunt path is eliminated, using the SCAN circuit shown in FIG. 22 makes it possible to examine a transfer section from the master circuit to the slave circuit.

(3) Clock distribution circuit

FIGS. 26 to 30 show examples of the clock distribution circuit for the flip-flop circuit according to the present invention. A clock chopper circuit for maintaining the width of the negative part of the clock at the constant time period is known, therefore, a description of the clock chopper circuit will be omitted.

Figure 26:
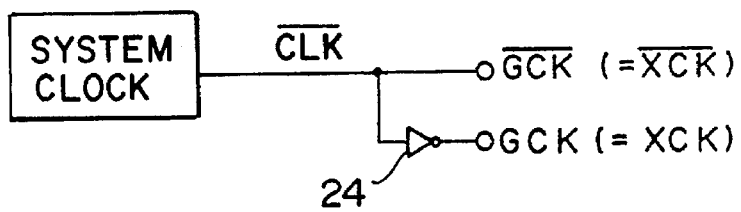
FIGS. 26 to 30 show examples of a clock distribution circuit for the flip-flop circuit according to the present invention.

FIG. 26 shows the clock distribution circuit that produces the clocks GCK, /GCK from the clock /CLK. In the circuit, the clock GCK is generated by inverting the clock /CLK in an inverter 24. When this clock distribution circuit is used, the clocks GCK, /GCK are used as the clocks XCK, /XCK which drive the transfer gate (for example, the transfer gate 7 in FIG. 15A) located in the feedback loop of the flip-flop circuit, namely GCK=XCK, /GCK=/XCK.

Figure 27:
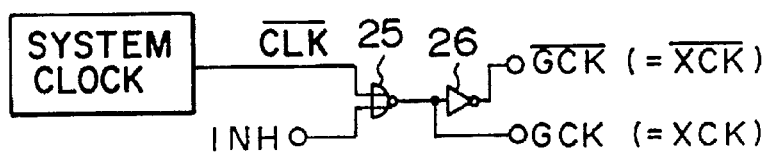

FIG. 27 shows the clock distribution circuit shown in FIG. 26 to which the clock control input INH is added. When the INH is as the high level, the input of the master circuit is at an opened state and the input of the slave circuit is at a closed state (for example, the transfer gate 4 is conductive in FIG. 15A). In such a situation, the flip-flop circuit stops taking new data into itself.

Figure 28:
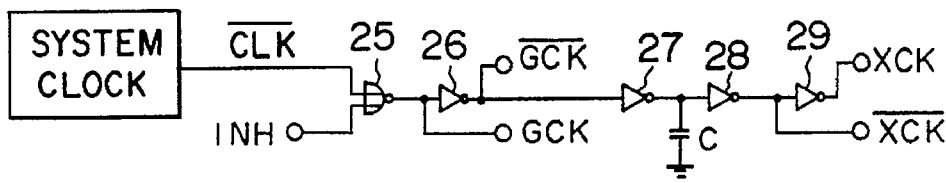

FIG. 28 shows a configuration of the clock distribution circuit in which the clocks XCK, /XCK are shifted from the clocks GCK, /GCK.

For example, in FIG. 15A, when the transfer gate 7 becomes conductive at the rising edge of the clock /CLK, the output of the inverter 1 competes with the output of the inverter 8. Therefore, by delaying the instance when the transfer gate becomes conductive, undesired competition may be prevented. And thus, this may improve the delay time, the setup time and the hold time of the flip-flop circuit. Further, the flip-flop circuit shown in FIG. 17 may also operate in the same way as that in FIG. 15A, and may have the same advantage.

In the flip-flop circuit shown in FIG. 18, the instance when the transfer gate 14 becomes conductive is delayed from a timing when the transfer gate 2 becomes non-conductive. Therefore, though fabrication dispersion of elements within LSI circuits is taken into account, the flip-flop circuit may be designed to surely prevent the racing from being caused. The transfer gate 14 shown in FIG. 18 may be added to the other flip-flop circuits shown in FIGS. 15, 16, 17, etc.

Figure 31:
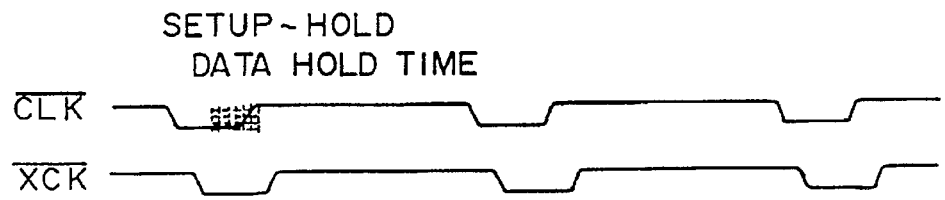
FIG. 31 shows clock waveforms of clocks in the clock distribution circuit shown in FIG. 28.

In the clock distribution circuit shown in FIG. 28, to ensure the required delay time, an inverter 27 and an additional capacitance C are disposed. The clock waveforms of the clocks are shown in, for example, FIG. 31.

To ensure the above-mentioned delay time, other methods of gates, interconnection lines, and a fan-out load may be used as well as the method of the inverter 27 and the additional capacitance shown in FIG. 28.

The above-mentioned delay time is preferably selected to be the hold time of the flip-flop circuit. The long delay time may cause dispersion of the delay time and increase of a period of the dynamic state.

Figure 29:
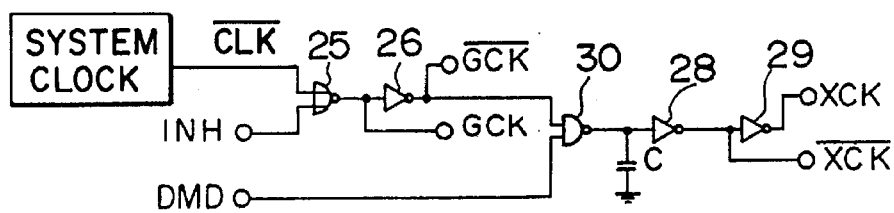

FIG. 29 shows the clock distribution circuit which is constructed such that the clock XCK of the circuit shown in FIG. 28 can be controlled by a signal /DVD (dynamic mode).

In general, a computing system requires a higher reliability. Therefore, before using the LSI circuits, a sufficient examination of the LSI circuits are required. More specifically, when applying the dynamic flip-flop circuit as shown in FIGS. 15 to 18, it is necessary to examine a lack of the operation margin due to the leakage, etc., according to the temperature, a variety of environmental conditions, and the clock cycle.

In the clock distribution circuit shown in FIG. 29, when the /DMD input is set to the low level, the transfer gates 7, 12 in the flip-flop circuit shown in FIGS. 15, 17 are maintained in a non-conductive condition. In this situation, when the clock cycle or the pulse width is changed, the holding time in the dynamic mode of the flip-flop circuit and an error operation due to the undesired leakage are detected and may be eliminated.

Figure 30:

FIG. 30 shows examples of the clock ACK generation circuit and the clock BCK generation circuit for the SCAN operation. Those circuits have the same configuration as that of the circuit shown in FIG. 26.

Each of the above-mentioned circuits may be commonly used in a plurality of flip-flop circuits.

(4) Improved computing system using a variety of flip-flop circuits:

Next, a description will be given of combination of the flip-flop circuits in which the setup time of each combination of circuits is improved.

Figure 32:
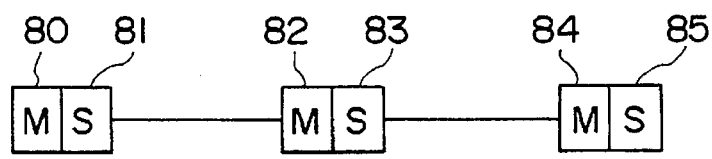
FIG. 32 shows a configuration image of serially connected master/slave-type flip-flop circuits.

FIG. 32 shows a configuration image of serially connected master-slave type flip-flop circuits. Numerals 80, 82, 84 respectively indicate master flip-flop circuits, and numerals 81, 83, 85 respectively indicate slave flip-flop circuits.

Figure 33:
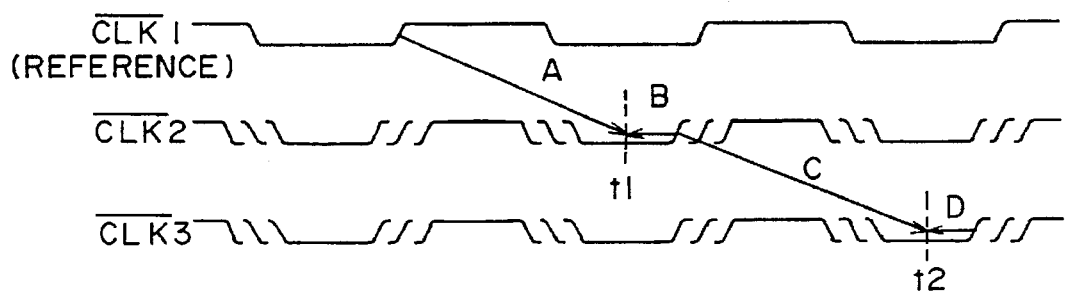
FIG. 33 shows a time chart of clocks applied to the serially connected master/slave-type flip-flop circuits shown in FIG. 32.

FIG. 33 shows a time chart of clocks applied to the serially connected master/slave-type flip-flop circuits shown in FIG. 32. A clock /CLK1 is a reference clock applied to the master flip-flop circuit 80 and the slave flip-flop circuit 81. A clock /CLK2 is applied to the master flip-flop circuit 82 and the slave flip-flop circuit 83, and a clock /CLK3 is for the flip-flop circuits 84 and 85. In the FIG. 33, fluctuation of the clock /CLK2, /CLK3 is shown.

In the configuration shown in FIG. 32, an output of the slave flip-flop circuit 81 is produced by a rising edge of the clock /CLK1, and an output of the slave flip-flop circuit 83 is produced by a rising edge of the clock /CLK2. The master flip-flop circuits 82, 84 take receive data also by the rising edge of the clock (in this instance, the transfer gate in the master flip-flop circuit is closed). Since such configuration may prevent the racing from being caused and permits easy designing, it has been widely used.

However, as shown in FIG. 33, assuming that the clock /CLK1 of the flip-flop circuits 80, 81 for transmitting the data is the reference clock, there is the fluctuation (clock skew) in the phase of the clock /CLK2. In the data transmission from the slave flip-flop circuit 81 to the master flip-flop circuit 82, the data needs to arrive at the master flip-flop circuit 82 before a timing t1. The timing t1 is by the setup time B earlier than the earliest shifted rising edge of the clock /CLK2. Namely, the data from the slave flip-flop circuit 81 must arrive at the master flip-flop circuit 82 within a period of time A. In the same way, data from the slave flip-flop circuit 83 needs to arrive at the master flip-flop circuit 84 before a timing t2 which is by the setup time D earlier than the earliest shifted rising edge of the clock /CLK3, namely within a period of time C.

In the data transmission between the flip-flop circuits, each consisting of the master and slave flip-flop circuits, the data needs to be transmitted within a period determined by subtracting the clock skew and the setup time from the clock cycle.

Figure 34:
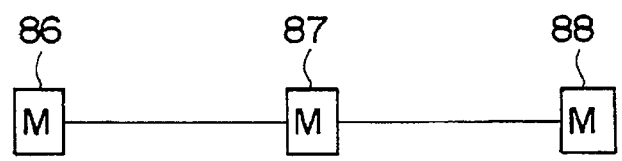
FIG. 34 shows a configuration image of serially connected master-type flip-flop circuits.
Figure 35:
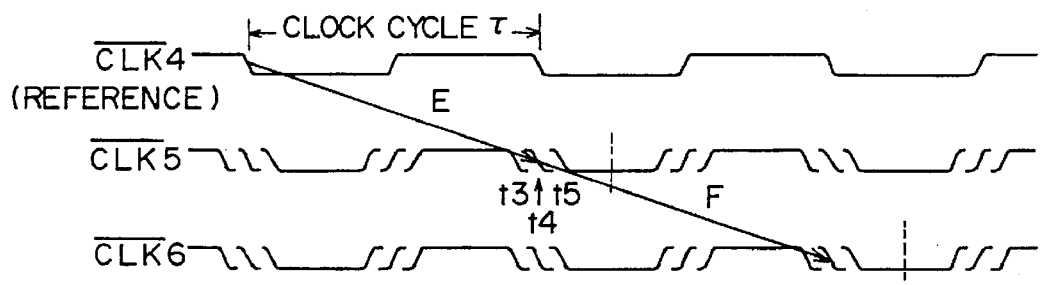
FIG. 35 shows a time chart of clocks applied to the serially connected master-type flip-flop circuits shown in FIG. 34.

FIG. 34 shows a configuration image of serially connected master-type flip-flop circuits. FIG. 35 shows a time chart of clocks applied to the serially connected master-type flip-flop circuits shown in FIG. 34. In FIG. 34, numerals 86, 87, 88 indicate master flip-flop circuits. In FIG. 35, a clock /CLK4 is a reference clock applied to the master flip-flop circuit 86. Clocks /CLK5 and /CLK6 are respectively applied to the master flip-flop circuits 87 and 88. In the FIG. 35, fluctuation of the clocks /CLK5, /CLK6 to the reference clock /CLK4 is also shown.

In the data transmission between the master flip-flop circuits, the output data of the master flip-flop circuit 86 is produced at the falling edge of the clock /CLK4 (corresponds to the MOT output mentioned before).

On the other hand, the master flip-flop circuit 87 takes the data from the master flip-flop circuit 86 at the rising edge of the clock /CLK5. Therefore, as shown in FIG. 35, the data may arrive before a timing represented by a dotted line in the negative pulse section of the clock /CLK5.

When the data by the clock /CLK4 from the master flip-flop circuit 86 arrives at the master flip-flop circuit 87 just before the timing represented by the dotted line in the clock /CLK5, a time margin for transmitting to the master flip-flop circuit 88 is reduced. Therefore, in general, the data from the mater flip-flop circuit 86 is adjusted to arrive before a timing t4 in the clock /CLK5.

In the above description, the clock /CLK4 is considered to be the reference clock. An important point is that the fluctuation of the clock /CLK5 to the clock /CLK4 and the fluctuation of the clock /CLK6 to the clock /CLK4 are almost the same from consideration of characteristics of the clock skew. For example, even if the falling edge of the clock /CLK5 is shifted earlier than a timing t3, the absolute phase of the clock /CLK6 is not shifted earlier than the phase of the clock /CLK5.

Therefore, when the phase of the clock /CLK5 is shifted to the timing t3, if the master flip-flop circuit 87 operating with the clock /CLK5 operates until a timing t4, transmission of the data from the master flip-flop circuit 87 to the master flip-flop circuit 88 is delayed by that operational time. However, in the master flip-flop circuit 88, the clock /CLK6 may be shifted earlier by a maximum time t3, and the delay time and the shifted time are not accumulated. Namely, for example, if the data from the master flip-flop circuit 88 is feedback to the master flip-flop circuit 86 operating with the clock /CLK4, the phase delay is adjusted and an overdelay is not caused.

In the transmission between the serially connected master flip-flop circuits, a period from a leading edge (the falling edge) to the timing represented by the dotted line in the clock /CLK5 contributes to absorb the clock skew. Therefore, there is no need to taking the setup time into account.

However, in the transmission between the serially connected master flip-flop circuits shown in FIG. 34, the data is transmitted for the period from the leading edge of the clock to the trailing edge of the clock of the receive flip-flop circuit, namely the clock cycle τ+the clock width. This configuration has a disadvantage of the racing being easily caused.

Figure 36:
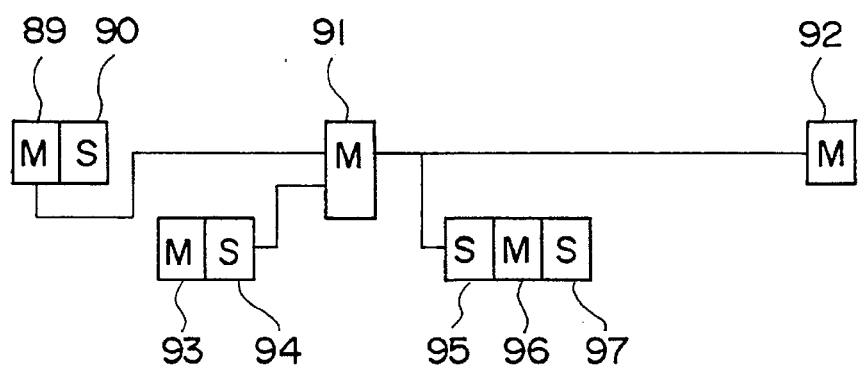
FIG. 36 shows a configuration image of combination of the master/slave-type flip-flop circuits and the master-type flip-flop circuits.

FIG. 36 shows a configuration image of combination of the master/slave-type flip-flop circuits and the master type flip-flop circuits. In this configuration, an advantage of the transmission between the serially connected master/slave-type flip-flop circuits shown in FIG. 32 and an advantage of the transmission between the serially connected master flip-flop circuits shown in FIG. 34 are combined to prevent the overdelay (enabling a high speed cycle) and the racing.

In FIG. 36, numerals 89, 91, 92, 93, 96 respectively indicate master flip-flop circuits, and numerals 90, 94, 95, 97 respectively indicate slave flip-flop circuits. The master flip-flop circuits 89, 93 and the slave flip-flop circuit 90, 94 respectively construct the master/slave-type flip-flop circuits. The slave flip-flop circuits 95, 97 and the master flip-flop circuit construct a slave/master/slave-type flip-flop circuit. A transmission from the master flip-flop circuit 89 to the master flip-flop circuit 91 is a long path (gates in the path are omitted in the drawing, a long line in the drawing corresponds to a large delay transmission line), and uses the transmission between the master flip-flop circuits shown in FIG. 34. A transmission from the master flip-flop circuit 91 to the master flip-flop circuit 92 is also a long path.

On the other hand, a transmission between the slave flip-flop circuit 94 to the master flip-flop circuit 91 is a short path, and uses the transmission between the output of the slave flip-flop circuit and the master flip-flop circuit shown in FIG. 32. Though the transmission from the master flip-flop circuit 91 to the master flip-flop circuit 92 is the long path, the master flip-flop circuit 96 is located close to the master flip-flop circuit 91. Therefore, the slave flip-flop circuit 95 constructed with the dynamic flip-flop circuit shown in FIG. 18 is inserted between the master flip-flop circuits 91, 96 to prevent the racing from being caused.

In this way, by properly combining and using the slave flip-flop circuit in the output side of the master flip-flop circuit and the slave flip-flop circuit (being operative as a race killer) in the input side thereof, it is impossible to construct a computer system preventing the racing and enabling the high-speed cycle operation.

(5) Other embodiments

The configurations of the CMOS circuits in the above-mentioned embodiments are not limited to a silicon semiconductor and may be extended to conventional MOS-type FETs.

It is well known in this art that the transfer gates 2, 7 are provided by disposing transistors having the same polarity (P, N) in the same isolated area.

Figure 37:
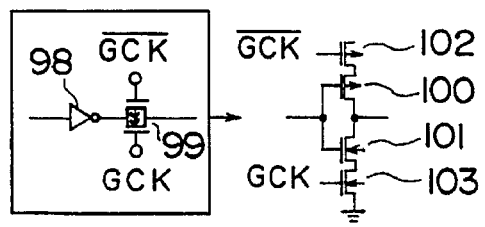
FIG. 37 shows an example of a configuration of a clocked inverter circuit combining the inverter and the transfer gate.

Further, it is well known in this art that the combination of the inverter (including the NAND and the NOR circuits) and the transfer gate may be changed to a clocked inverter circuit shown in FIG. 37.

Figure 38:
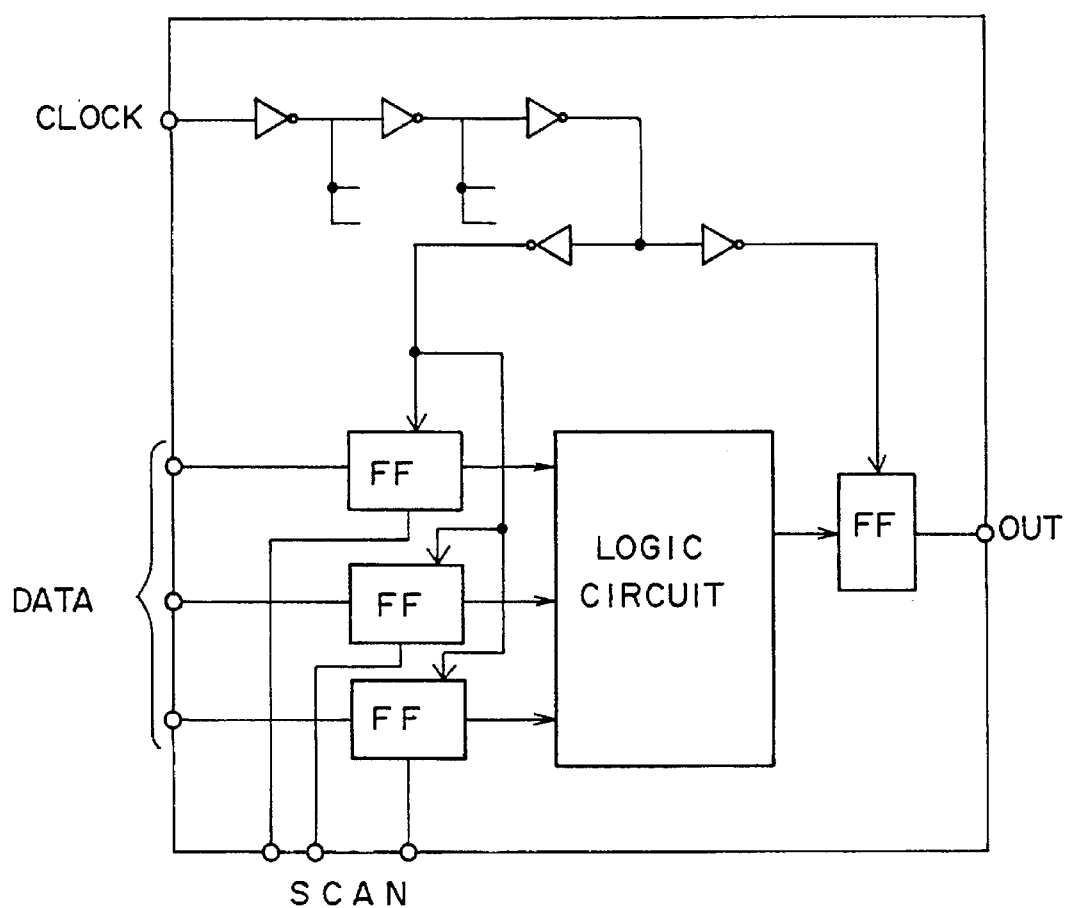
FIG. 38 shows an example of an LSI device including flip-flop circuits according to the prevent invention.

FIG. 38 shows an example of an LSI device including flip-flop circuits according to the prevent invention. The LSI device includes the flip-flop circuits described in the above-mentioned embodiments and combined logic circuits. The combined logic circuit may have the flip-flop circuits according to the present invention, for example, as a shift resister, a counter, etc. The LSI device further has a clock input port, data input ports and SCAN input ports for SCAN control signals.

Since the data is transmitted and controlled by the flip-flop circuit according to the present invention in the LSI device, the LSI device may operate at the higher operational speed as compared with the device using the conventional flip-flop circuits.

As described above, the present inventions have the following features.

The flip-flop circuit according to the present invention comprises the master circuit constructed with the static flip-flop circuit including the feedback loop and the slave circuit constructed with the dynamic flip-flop circuit. And in the flip-flop circuit, the clock pulse width determined by between the clock edge for taking the data in the master circuit and the clock edge for closing the master circuit is set to less than the given value regardless of the period of the repeated cycle of the clock pulse. Therefore, this enables the flip-flop circuit to operate at the high speed, and prevents the data in the slave circuit from being degraded even if the period of the clock cycle becomes long.

Further, adding the scan-in circuit including at least one transfer gate, and the scan-out circuit including the transfer gate and the static flip-flop circuit, enables the scanning circuit to operate at the low-speed cycle.

Still further, in the flip-flop circuit according to the present invention, the output from the master flip-flop circuit is transmitted to the master flip-flop circuit through the long-delay path, and the output of the slave flip-flop circuit or the output of the master flip-flop circuit are respectively transmitted to the master flip-flop circuit or the slave flip-flop circuit through the short-delay path. This may prevent the racing and the overdelay and makes it possible to construct the computer system operating with the high-speed clock.

Further, the present invention is not limited to these embodiments, but various variations and modifications may be made without departing from the scope of the present invention.

What is claimed is:

1. A flip-flop circuit comprising:
a master circuit including a static flip-flop with a feedback loop; and
a slave circuit including a dynamic flip-flop which is formed without a feedback loop;
wherein a clock signal is applied to the master circuit and the slave circuit from a clock signal source, a clock width of the clock signal determined by a time period from a clock edge of the clock signal for taking data into the master circuit to another clock edge of the clock signal for closing the master circuit being set to less than a given time period to reduce degradation of data held in said slave circuit.

2. The flip-flop circuit as claimed in claim 1, wherein the clock signal source comprises a clock signal generation circuit which generates said clock signal.

3. The flip-flop circuit as claimed in claim 2, wherein the clock signal generation circuit is configured to generate first and second clock signals having opposite phases,
wherein the first and second clock signals are applied to the master circuit and the slave circuit.

4. The flip-flop circuit as claimed in claim 3, wherein the clock signal generation circuit comprises first control means for stopping the generation of the first and second clock signals based on a first clock control signal supplied externally, said first control means thereby controlling the master circuit to be closed and the slave circuit to be opened.

5. The flip-flop circuit as claimed in claim 3, wherein the clock signal generation circuit comprises a delay circuit for delaying the first and second clock signals by a time period corresponding to a hold time in the flip-flop circuit, wherein the delayed clock signals from the delay circuit are supplied to a feedback loop of the master circuit.

6. The flip-flop circuit as claimed in claim 5, wherein the clock signal generation circuit further comprises second control means for supplying the delayed clock signals based on a second clock control signal supplied externally, said second control means thereby controlling the feedback loop of the master circuit to be in an isolated state.

7. The flip-flop circuit as claimed in claim 3, wherein the master circuit further comprises a first transfer gate for controlling data input thereto, and a feedback loop, said feedback loop including at least two gates and a second transfer gate coupled to said at least two gates, and wherein the slave circuit comprises a third transfer gate.

8. The flip-flop circuit as claimed in claim 3, wherein the master circuit further comprises a first transfer gate for controlling data input, and a feedback loop, said feedback loop including at least two gates, and the slave circuit comprises a second transfer gate.

9. The flip-flop circuit as claimed in claim 7, wherein said third transfer gate of the slave circuit is located within said feedback loop of the master circuit, and coupled to said at least two gates.

10. The flip-flop circuit as claimed in claim 3, further comprising a transfer gate disposed at an input side of the master circuit.

11. The flip-flop circuit as claimed in claim 3, further comprising a plurality of transfer gates disposed at an input side of the master circuit.

12. The flip-flop circuit as claimed in claim 3, further comprising a scan-in circuit including at least a first transfer gate and a scan-out circuit including a second transfer gate and a static flip-flop, wherein the scan-in circuit and the scan-out circuit are connected such that the flip-flop circuit is constructed in a chain form.

13. The flip-flop circuit as claimed in claim 12, wherein an output of the scan-in circuit and an input of the scan-out circuit are commonly connected to each other.

14. A flip-flop circuit comprising:
at least two first flip-flops latching input data at a first level of a clock pulse, said first flip-flops being connected by a first path having a first delay which is determined so as to prevent a racing condition; and
a second flip-flop latching input data at a second level of said clock pulse, said second flip-flop and one of said at least two first flip-flops being connected by a second path having a second delay smaller than the first delay;

wherein data is transmitted between the at least two first flip-flops through the first path and is transmitted between the second flip-flop and one of said at least two first flip-flops through the second path, whereby a racing and an overdelay are prevented.

15. An electronic device comprising:

a flip-flop circuit having a master circuit including a static flip-flop with a feedback loop and a slave circuit including a dynamic flip-flop which is formed without a feedback loop;

a clock signal generation circuit generating a clock signal and supplying the clock signal to the flip-flop circuit, wherein a clock width of the clock signal is determined by a time period from a clock edge for taking data into the master circuit to another clock edge for closing the master circuit, said time period being set to less than a predetermined time period to reduce degradation of data held in said slave circuit; and a logic circuit for processing signals to and from said flip-flop circuit.

* * * * *